United States Patent
Yew et al.

(10) Patent No.: US 9,450,184 B2
(45) Date of Patent: Sep. 20, 2016

(54) MULTILAYER-STACKED RESISTIVE RANDOM ACCESS MEMORY DEVICE

(71) Applicant: National Tsing Hua University, Hsinchu (TW)

(72) Inventors: Tri-Rung Yew, Hsinchu (TW); Ying-Chan Hung, Xihu Township (TW); Tsang-Hsuan Wang, Kaohsiung (TW); Pin Chang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/736,958

(22) Filed: Jun. 11, 2015

(65) Prior Publication Data

US 2016/0240779 A1 Aug. 18, 2016

(30) Foreign Application Priority Data

Feb. 16, 2015 (TW) .............................. 104105392 A

(51) Int. Cl.
*H01L 45/00* (2006.01)
*H01C 17/06* (2006.01)

(52) U.S. Cl.
CPC ........... *H01L 45/146* (2013.01); *H01L 45/122* (2013.01); *H01L 45/142* (2013.01)

(58) Field of Classification Search
CPC . H01L 45/142; H01L 45/145; H01L 45/146; H01L 29/6609; H01L 29/8605; H01L 29/8615; G11C 13/0007; G11C 2213/31; G11C 2213/32; G11C 2213/34
See application file for complete search history.

(56) References Cited

U.S. PATENT DOCUMENTS

| | | | |
|---|---|---|---|
| 8,000,128 B2 | 8/2011 | Li et al. | |
| 8,248,640 B2 | 8/2012 | Tanaka et al. | |
| 8,502,343 B1 * | 8/2013 | Jha | H01L 45/08 257/536 |
| 2006/0175598 A1 * | 8/2006 | Krieger | G11C 13/0009 257/4 |
| 2007/0120580 A1 * | 5/2007 | Kim | H01L 45/04 326/93 |
| 2009/0039343 A1 * | 2/2009 | Kugler | G01N 27/414 257/40 |
| 2009/0072246 A1 * | 3/2009 | Genrikh | H01L 27/101 257/79 |
| 2010/0110758 A1 | 5/2010 | Li et al. | |
| 2013/0214235 A1 | 8/2013 | Hong et al. | |
| 2014/0284540 A1 * | 9/2014 | Suguro | H01L 45/085 257/4 |
| 2014/0361864 A1 * | 12/2014 | Fukuda | C23C 14/0036 338/20 |

* cited by examiner

*Primary Examiner* — Dale E Page
*Assistant Examiner* — John Bodnar
(74) *Attorney, Agent, or Firm* — Birch, Stewart, Kolasch & Birch, LLP

(57) ABSTRACT

A multilayer-stacked resistive random access memory device includes: first and second electrode layers; a resistive oxide layer which is electrically coupled to the first and second electrode layers, which exhibits resistive switching characteristics and which includes a metal oxide containing a first metal selected from the group consisting of W, Ti, Zr, Sn, Ta, Ni, Ag, Cu, Co, Hf, Ru, Mo, Cr, Fe, Al, and combinations thereof; and a sulfide layer contacting the resistive oxide layer and including a metal sulfide that contains a second metal that is the same as the first metal.

9 Claims, 9 Drawing Sheets

MULTILAYER-STACKED RESISTIVE RANDOM ACCESS MEMORY DEVICE

CROSS-REFERENCE TO RELATED APPLICATION

This application claims priority of Taiwanese Patent Application No. 104105392, filed on Feb. 16, 2015.

FIELD

The disclosure relates to a multilayer-stacked resistive random access memory device, more particularly to a multilayer-stacked resistive random access memory device having a resistive oxide layer and a sulfide layer contacting the resistive oxide layer.

BACKGROUND

U.S. Patent Application Publication No. 2013/0214235 discloses a resistive random access memory device that includes a lower electrode, a changeable resistance diode formed on the lower electrode, and an upper electrode formed on the changeable resistance diode. The changeable resistance diode defines a p-n junction, has rectifying characteristics and resistive characteristics, and includes a p-type changeable resistance semiconductor layer formed on the lower electrode, and an n-type changeable resistance semiconductor layer formed on the p-type changeable resistance semiconductor layer. The p-type changeable resistance semiconductor layer is made from a material, such as $SnO_x$ (where $1.2 \leq x < 2$). The n-type changeable resistance semiconductor layer is made from a material, such as $TiO_x$ (where $1.2 \leq x \leq 1.89$), and cooperates with the p-type changeable resistance semiconductor layer to define the p-n junction so as to provide the rectifying characteristics.

SUMMARY

An object of the disclosure is to provide a multilayer-stacked resistive random access memory device that exhibits both resistive characteristics and rectifying characteristics.

According to the disclosure, there is provided a multilayer-stacked resistive random access memory device that includes: first and second electrode layers; a resistive oxide layer which is electrically coupled to the first and second electrode layers, which exhibits resistive switching characteristics and which includes a metal oxide containing a first metal selected from the group consisting of W, Ti, Zr, Sn, Ta, Ni, Ag, Cu, Co, Hf, Ru, Mo, Cr, Fe, Al, and combinations thereof; and a sulfide layer contacting the resistive oxide layer and including a metal sulfide that contains a second metal that is the same as the first metal.

BRIEF DESCRIPTION OF THE DRAWINGS

In drawings which illustrate an embodiment of the disclosure.

DETAILED DESCRIPTION

Figure 1:
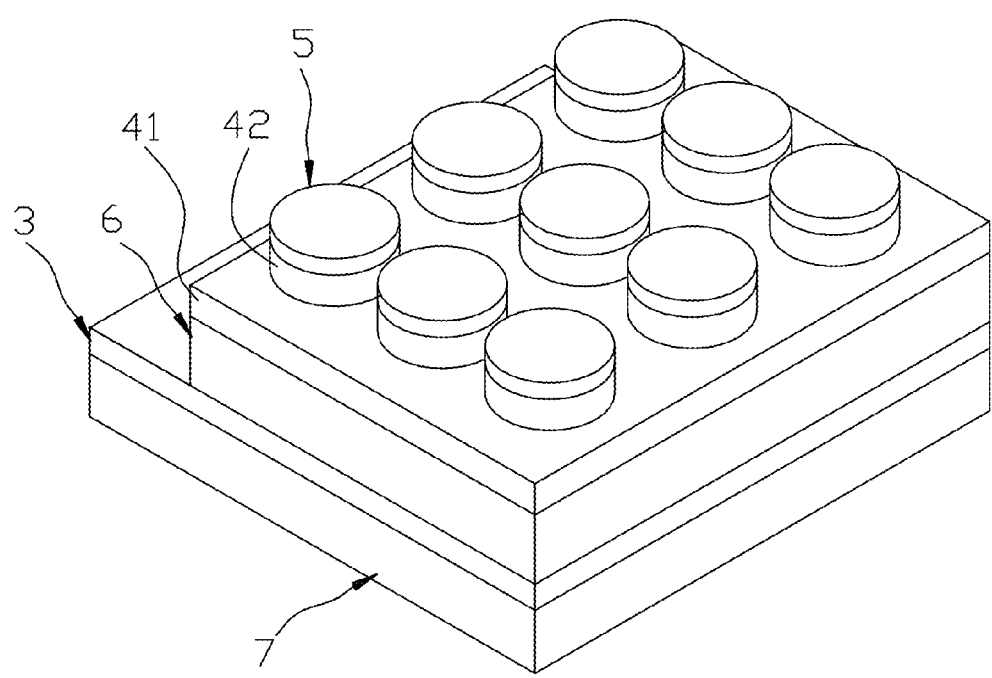
FIG. 1 is a perspective view of the embodiment of a multilayer-stacked resistive random access memory device according to the disclosure.

FIG. 1 illustrates the embodiment of a multilayer-stacked resistive random access memory device according to the disclosure.

The multilayer-stacked resistive random access memory device includes: a substrate 7 made from a material, such as glass; first and second electrode layers 3, 5 disposed on the substrate 7, the second electrode layer 5 having a pattern of circular electrode pads that are arranged in an array; a crystalline resistive oxide layer 41 which is disposed between and which is electrically coupled to the first and second electrode layers 3, 5, which exhibits resistive switching characteristics, and which includes a first metal oxide containing a first metal selected from the group consisting of W, Ti, Zr, Sn, Ta, Ni, Ag, Cu, Co, Hf, Ru, Mo, Cr, Fe, Al, and combinations thereof; a conductive oxide layer 42 formed on the resistive oxide layer 41 and disposed between the second electrode layer 5 and the resistive oxide layer 41 and contacts the second electrode layer 5, the conductive oxide layer 42 having a pattern of circular conductive oxide pads that are arranged in an array and that overlap respectively the electrode pads; and a sulfide layer 6 disposed between and contacting the resistive oxide layer 41 and the first electrode layer 3 and including a metal sulfide that contains a second metal that is the same as the first metal.

In this embodiment, the sulfide layer 6 cooperates with the resistive oxide layer 41 to form a p-n junction therebetween, so that the multilayer-stacked resistive random access memory device exhibits rectifying characteristics.

In certain embodiments, the metal sulfide is tin sulfide, and the first metal oxide is tin oxide having a formula of $SnO_{2-x}$, where $0 \leq x < 1$.

In certain embodiments, the resistive oxide layer 41 has a layer thickness ranging from 1 nm to 40 nm, the sulfide layer 6 has a layer thickness ranging from 0.1 μm to 10 μm, and the conductive oxide layer 42 has a layer thickness ranging from 1 nm to 500 nm. When the layer thickness of the resistive oxide layer 41 is less than 1 nm or greater than 40 nm, the switching characteristics thereof and the rectifying characteristics of the p-n junction may not be satisfactory. When the sulfide layer 6 is less than 0.1 μm, the rectifying characteristics of the p-n junction may not be satisfactory.

In certain embodiments, the conductive oxide layer 42 is made from a second metal oxide selected from the group consisting of indium tin oxide (ITO), indium zinc oxide (IZO), and aluminum zinc oxide (AZO).

Each of the first and second electrode layers 3, 5 is made from a material selected from the group consisting of Mo, Al, Ta, Pt, Cu, and Ag.

FIGS. 2A to 2E illustrate consecutive steps of a method of making the embodiment of the multilayer-stacked resistive random access memory device.

Figure 2A:
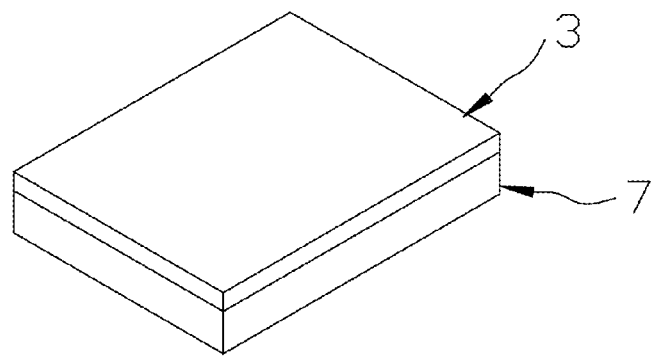
FIGS. 2A to 2E are schematic views illustrating consecutive steps of a method of making the embodiment shown in FIG. 1.
Figure 2B:
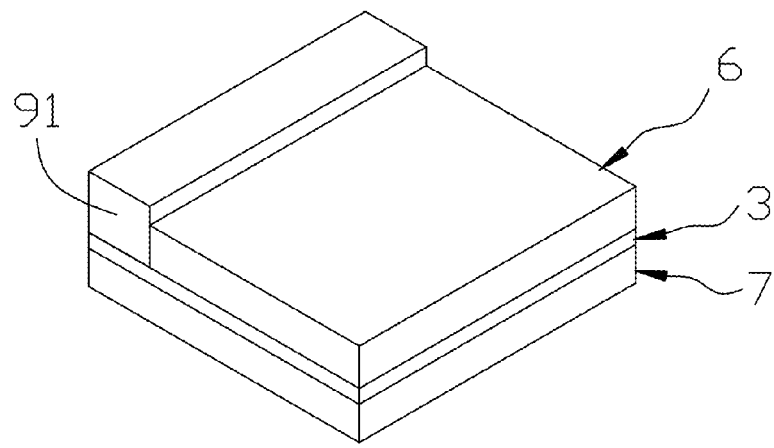
Figure 2C:
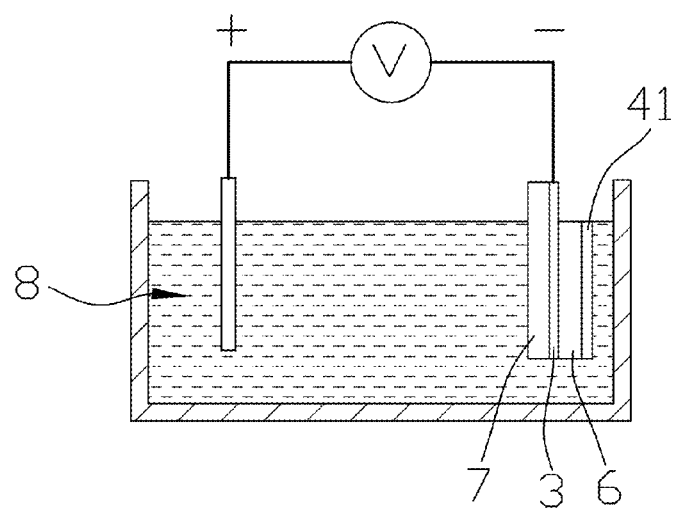
Figure 2D:
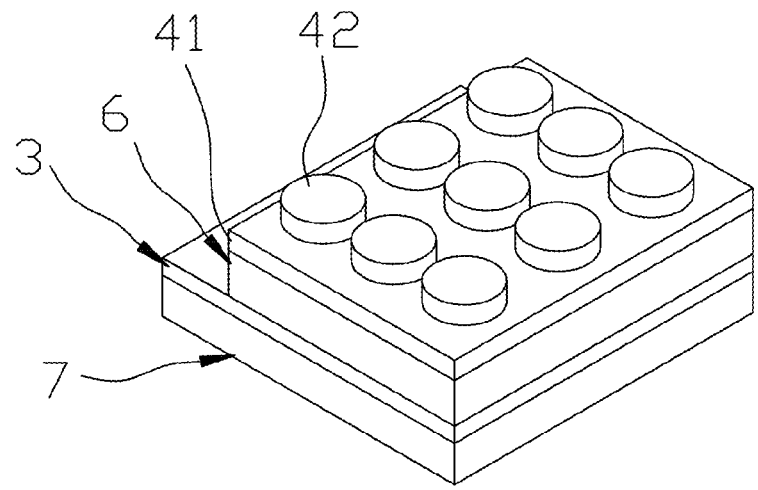
Figure 2E:
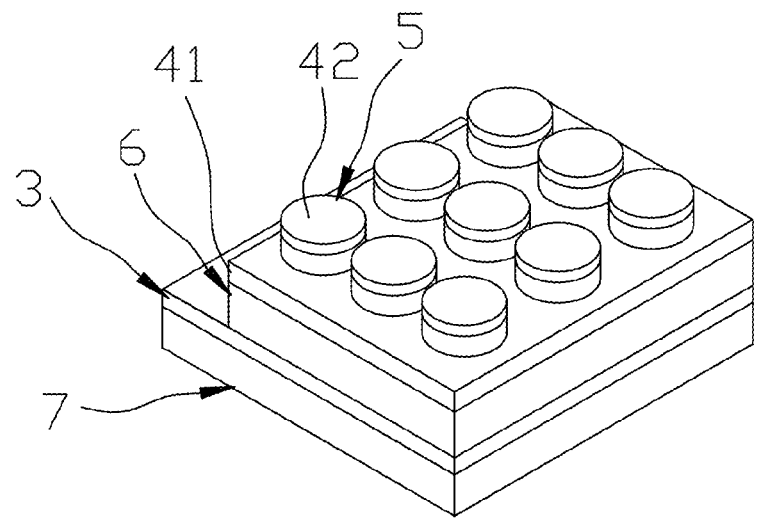

The method includes the steps of: forming a first electrode layer 3 on a glass substrate 7 using sputtering techniques (see FIG. 2A); covering an end portion of a surface of the first electrode layer 3 with a glass mask 91 (see FIG. 2B); forming a sulfide layer 6 on the remaining portion of the surface of the first electrode layer 3 using sputtering techniques (see FIG. 2B); removing the glass mask 91 (see FIG. 2C); oxidizing a surface of the sulfide layer 6 in an anodizing bath 8 using anodizing techniques to form a crystalline resistive oxide layer 41 on the sulfide layer 6 (see FIG. 2C); subjecting the resistive oxide layer 41 to annealing; covering a surface of the resistive oxide layer with a mask (not shown) to exposed predetermined regions of the surface of the resistive oxide layer 41; forming a conductive oxide layer 42 on the exposed regions of the resistive oxide layer 41 using sputtering techniques (see FIG. 2D); and forming a second electrode layer 5 on the conductive oxide layer 42 using sputtering techniques (see FIG. 2E).

The anodizing techniques may be conducted under a current density ranging from $-5$ $\mu A/cm^2$ to $-15$ $\mu A/cm^2$ for a period of from 150 seconds to 900 seconds. The annealing may be conducted at a temperature ranging from 450° C. to 550° C. for a period of from 0.5 hour to 1.5 hours.

The following examples are provided to illustrate the embodiment of the disclosure, and should not be construed as limiting the scope of the disclosure.

Example 1

A first electrode layer (metal: Mo) having a layer thickness of 300 nm was formed on a glass substrate (size: 1 cm×1.5 cm×0.7 cm) using sputtering techniques. A glass mask covered an end portion of a surface of the first electrode layer. A sulfide layer (metal sulfide: SnS) having a layer thickness of 2.5 μm was formed on the remaining portion of the surface of the first electrode layer using sputtering techniques so as to form an intermediate assembly. The glass mask was removed from the intermediate assembly. The intermediate assembly was placed in an oxalate aqueous solution (concentration: 10 mM) in an anodizing bath for anodizing a surface of the sulfide layer under a current density of $-10$ $\mu A/cm^2$ for a period of 150 seconds so as to form a resistive oxide layer ($SnO_{2-x}$) on the sulfide layer. The resistive oxide layer was annealed under a temperature of 500° C. A mask covered a surface of the resistive oxide layer so as to exposes predetermined regions of the surface of the resistive oxide layer. A conductive oxide layer (ITO) having a layer thickness of 10 nm was formed on the exposed regions of the surface of the resistive oxide layer through sputtering techniques. A second electrode layer (metal: Ag) having a layer thickness of 10 nm was then formed on the conductive oxide layer through sputtering techniques so as to form a multilayer-stacked resistive random access memory. The conductive oxide layer was formed into an array of circular oxide pads. The second electrode layer was formed into a plurality of circular electrode pads. Each of the oxide pads and the electrode pads had a diameter of 200 μm.

Figure 3:
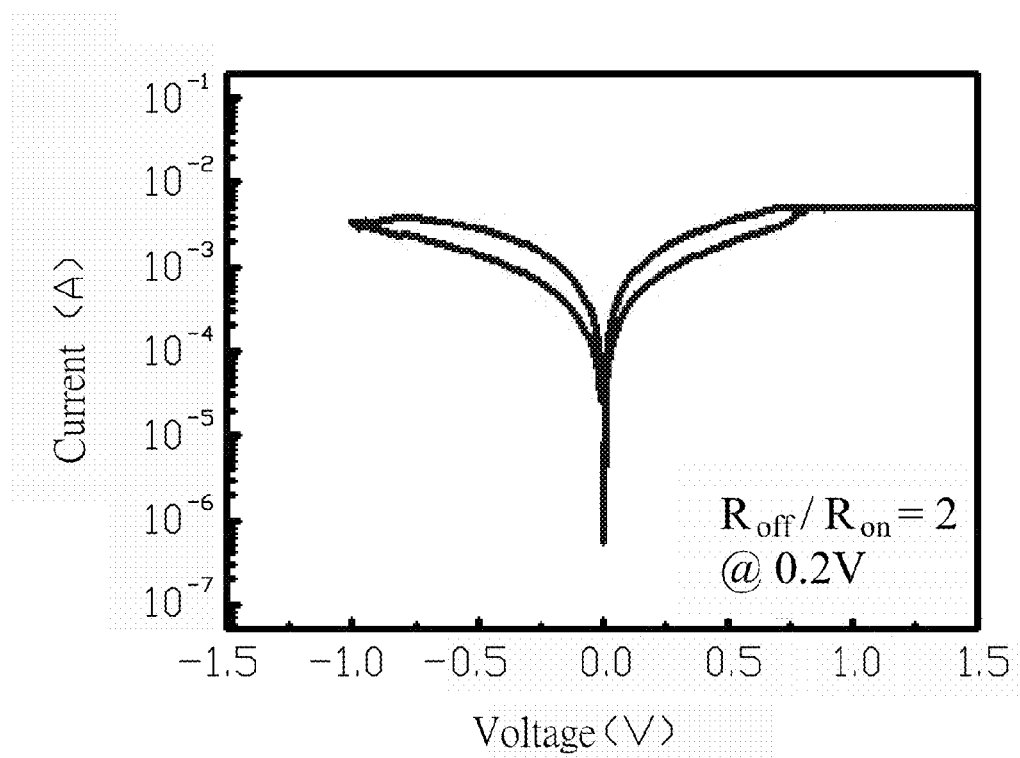
FIG. 3 is a diagram showing I-V characteristics of the multilayer-stacked resistive random access memory of Example 1.

FIG. 3 shows I-V characteristics of the multilayer-stacked resistive random access memory of Example 1. The results show that the multilayer-stacked resistive random access memory thus formed can be operated at a low voltage region (between $-1.0$V and $+1.5$V) for switching between a low resistance state (LRS or On state) and a high resistance state (HRS or Off state). In addition, the multilayer-stacked resistive random access memory thus formed has a ($R_{off}/R_{on}$) ratio of about 2 at a voltage of 0.2V, where $R_{off}$ is the resistance at the high resistance state and the $R_{on}$ is the resistance at the low resistance state. The ($R_{off}/R_{on}$) ratio may be increased by reducing the diameter of the electrode pads of the second electrode layer.

Example 2

Figure 4:
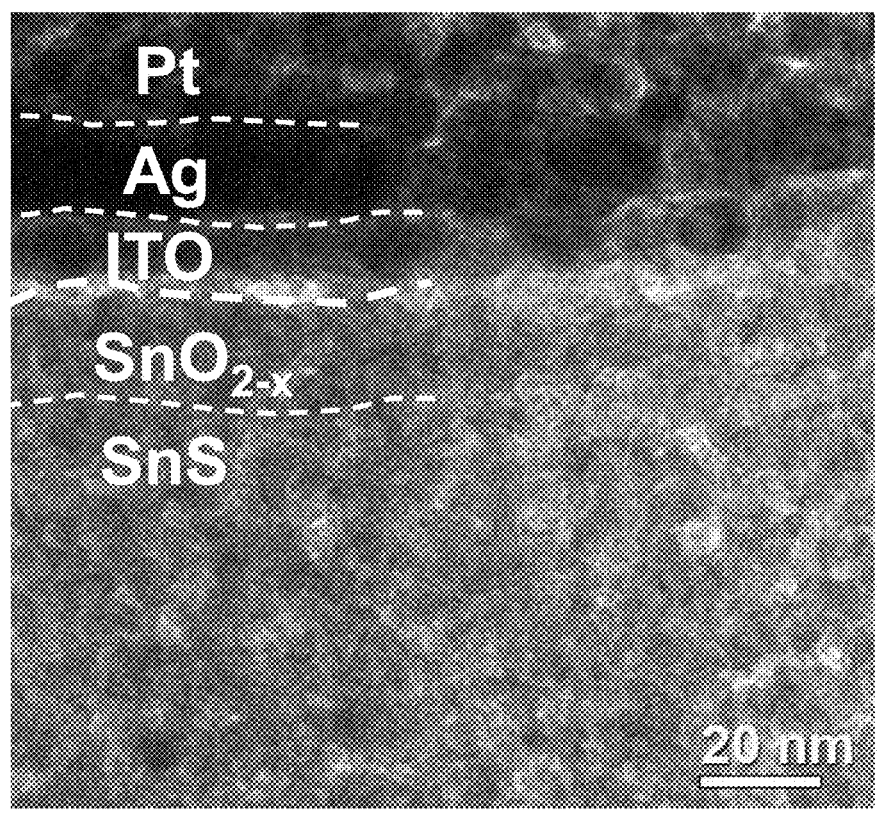
FIG. 4 is an SEM diagram of the multilayer-stacked resistive random access memory of Example 2.

The procedures and operating conditions of Example 2 were similar to those of Example 1, except that the anodizing was lasted for 450 seconds and that a protective metal (Pt) having a layer thickness of 10 nm was formed on the second electrode layer. FIG. 4 is an SEM diagram of the multilayer-stacked resistive random access memory of Example 2, which shows that the layer thickness of the resistive oxide layer ($SnO_{2-x}$) of Example 2 was about 20 nm.

Figure 5:
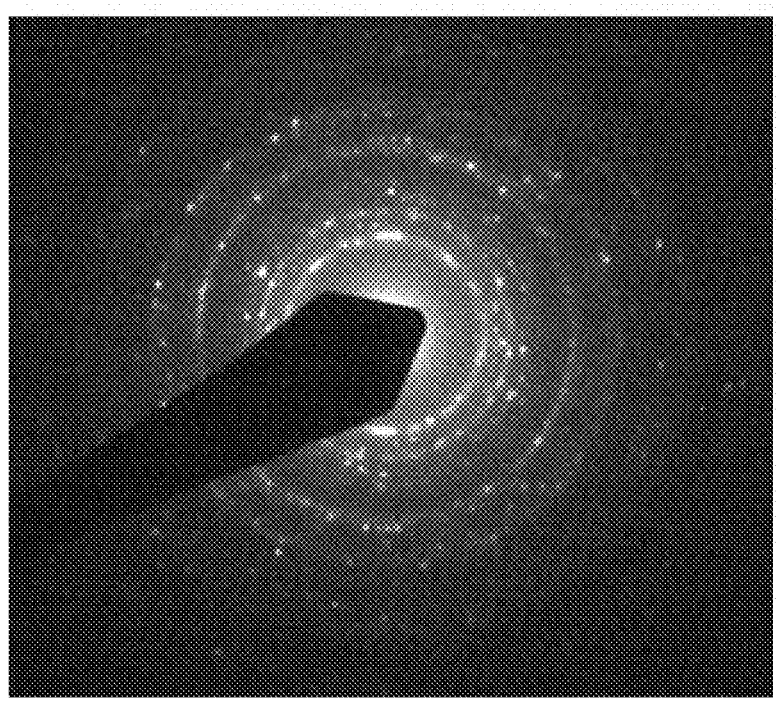
FIG. 5 is a TEM diagram of the multilayer-stacked resistive random access memory of Example 2.

FIG. 5 is a TEM diagram of the multilayer-stacked resistive random access memory of Example 2, which shows that the resistive oxide layer ($SnO_{2-x}$) of Example 2 has a polycrystalline structure.

Figure 6:
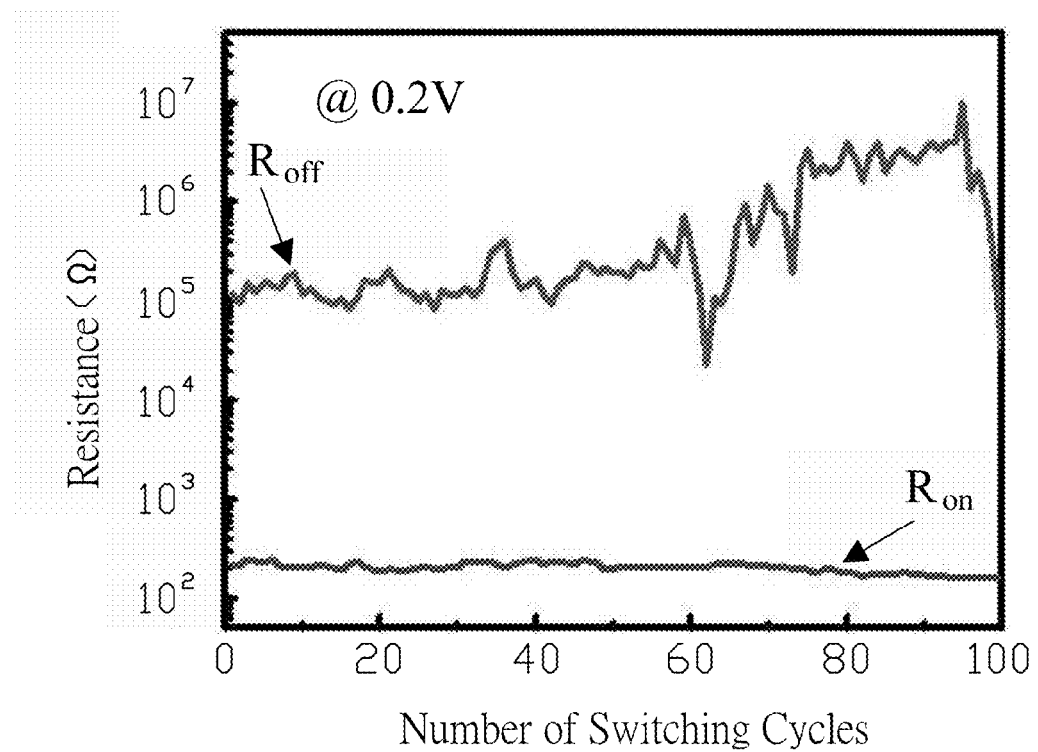
FIG. 6 is a diagram showing resistances of the multilayer-stacked resistive random access memory of Example 2 at $R_{on}$ and $R_{off}$ states for an endurance test.

FIG. 6 shows resistances of the multilayer-stacked resistive random access memory of Example 2 at $R_{on}$ and $R_{off}$ states for an endurance test (an operation by repeatedly switching between $R_{on}$ and $R_{off}$ states). In each switching cycle, the voltage applied to the multilayer-stacked resistive random access memory was varied in a sweeping cycle ($0V \rightarrow 1.5V \rightarrow -1.3V \rightarrow 0V$). The resistances at $R_{on}$ and $R_{off}$ states at a voltage of 0.2V were measured for each switching cycle. The results show that the ($R_{off}/R_{on}$) ratio still maintains at a value of around 1000 after 100 switching cycles, which is an indication that the multilayer-stacked resistive random access memory of Example 2 has stable switching characteristics.

Figure 7:
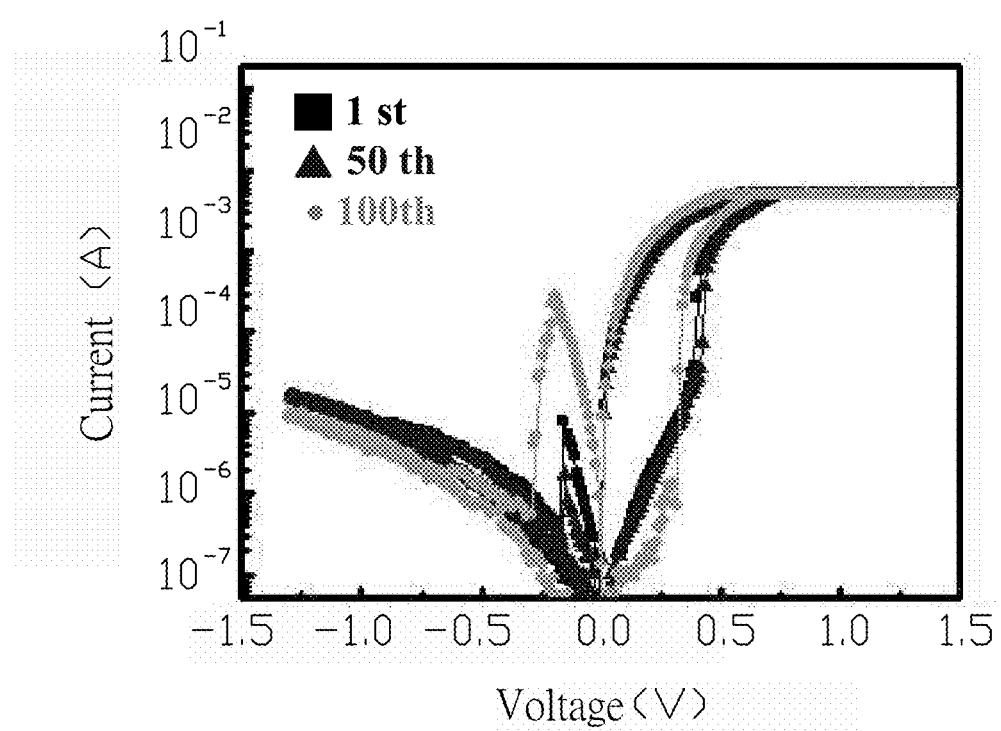
FIG. 7 is a diagram showing I-V characteristics of the multilayer-stacked resistive random access memory of Example 2.

FIG. 7 shows I-V characteristics of the multilayer-stacked resistive random access memory of Example 2 for the first switching cycle, the $50^{th}$ switching cycle and the $100^{th}$ switching cycle. The results show that the multilayer-stacked resistive random access memory thus formed can be operated at a low voltage region (between $-1.3$V and $+1.5$V) for switching between the low resistance state and the high resistance state. In addition, the I-V curve for the first switching cycle substantially overlaps the I-V curve for the $50^{th}$ switching cycle and approximately overlaps the I-V curve for the $100^{th}$ switching cycle, which is an indication that the multilayer-stacked resistive random access memory of Example 2 has a stable switching characteristics.

Example 3

The procedures and operating conditions of Example 3 were similar to those of Example 1, except that the anodizing was lasted for 900 seconds.

Figure 8:
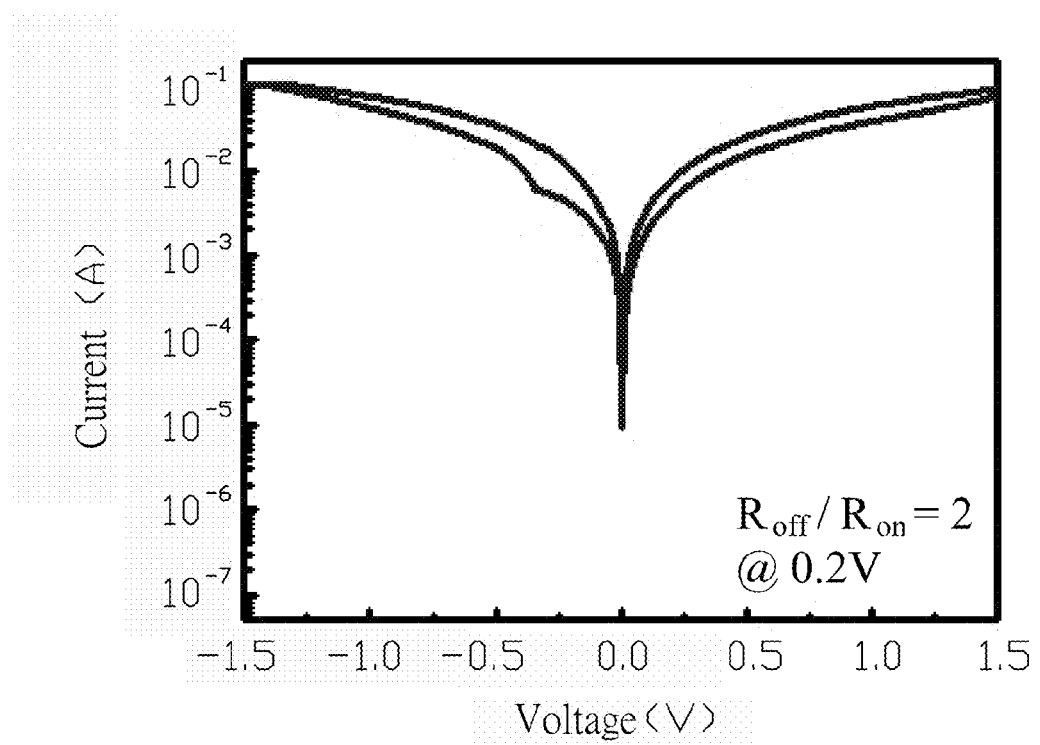
FIG. 8 is a diagram showing I-V characteristics of the multilayer-stacked resistive random access memory of Example 3.

FIG. 8 shows I-V characteristics of the multilayer-stacked resistive random access memory of Example 3. The results show that the multilayer-stacked resistive random access memory thus formed can be operated at a low voltage region (between $-1.5$V and $+1.5$V) for switching between the low resistance state and the high resistance state. In addition, the multilayer-stacked resistive random access memory thus formed has a ($R_{off}/R_{on}$) ratio of about 2 at a voltage of 0.2V. The ($R_{off}/R_{on}$) ratio may be increased by reducing the diameter of the electrode pads of the second electrode layer.

With the inclusion of the resistive oxide layer 41 and the sulfide layer 6 in the multilayer-stacked resistive random access memory device of the disclosure, the multilayer-stacked resistive random access memory device may be operated at a low voltage region, has a stable switching characteristics and provides rectifying characteristics.

While the disclosure has been described in connection with what is considered the exemplary embodiment, it is understood that the disclosure is not limited to the disclosed embodiment but is intended to cover various arrangements included within the spirit and scope of the broadest interpretation and equivalent arrangements.

What is claimed is:

1. A multilayer-stacked resistive random access memory device comprising:
    first and second electrode layers;
    a resistive oxide layer which is electrically coupled to said first and second electrode layers, which exhibits resistive switching characteristics, and which includes a first metal oxide containing a first metal selected from the group consisting of W, Ti, Zr, Sn, Ta, Ni, Ag, Co, Hf, Ru, Mo, Cr, Fe, Al, and combinations thereof;
    a sulfide layer contacting said resistive oxide layer, disposed between said resistive oxide layer and said first electrode layer, and including a metal sulfide that contains a second metal that is the same as said first metal, and
    a conductive oxide layer disposed between said resistive oxide layer and said second electrode layer;
    wherein said sulfide layer cooperates with said resistive oxide layer to form a p-n junction therebetween.

2. The resistive random access memory device of claim 1, wherein said metal sulfide is tin sulfide, and said first metal oxide is tin oxide having a formula of $SnO_{2-x}$, where $0 \leq x < 1$.

3. The resistive random access memory device of claim 1, wherein said resistive oxide layer has a layer thickness ranging from 1 nm to 40 nm.

4. The resistive random access memory device of claim 1, wherein said sulfide layer has a layer thickness ranging from 0.1 µm to 10 µm.

5. The resistive random access memory device of claim 1, wherein said conductive oxide layer is made from a second metal oxide selected from the group consisting of indium tin oxide, indium zinc oxide, and aluminum zinc oxide.

6. The resistive random access memory device of claim 1, wherein said conductive oxide layer contacts said second electrode layer.

7. The resistive random access memory device of claim 1, wherein each of said first and second electrode layers is made from a material selected from the group consisting of Mo, Al, Ta, Pt, Cu, and Ag.

8. The resistive random access memory device of claim 1, wherein said sulfide layer is disposed between said first electrode layer and said resistive oxide layer and contacts said first electrode layer.

9. The resistive random access memory device of claim 1, wherein said resistive oxide layer is crystalline.

* * * * *